(12) United States Patent
Kramer et al.

(10) Patent No.: US 7,063,441 B2
(45) Date of Patent: Jun. 20, 2006

(54) SOFT LIGHT FIXTURE

(76) Inventors: Eric W. Kramer, 3108 Tyrol Dr., Laguna Beach, CA (US) 92651; Thomas T. Nagano, 11342 Bos St., Cerritos, CA (US) 90701

( * ) Notice: Subject to any disclaimer, the term of this patent is extended or adjusted under 35 U.S.C. 154(b) by 179 days.

(21) Appl. No.: 10/613,906

(22) Filed: Jul. 2, 2003

(65) Prior Publication Data

US 2005/0002190 A1   Jan. 6, 2005

(51) Int. Cl.
*F21V 5/04* (2006.01)
(52) U.S. Cl. .................. 362/240; 362/231; 362/244; 362/800
(58) Field of Classification Search ............... 362/231, 362/240, 244–246, 545, 555, 800
See application file for complete search history.

(56) References Cited

U.S. PATENT DOCUMENTS

| 1,318,263 A | 10/1919 | Caccese |
| 1,365,027 A | 1/1921 | Farrar |
| 1,838,789 A | 12/1931 | Schepperle |
| 2,119,734 A | 6/1938 | Caldwell |
| 3,748,456 A | 7/1973 | Brien |
| 4,280,171 A | 7/1981 | Huang |
| 4,831,755 A | 5/1989 | Rodriguez |
| 5,355,289 A | 10/1994 | Krenn |
| 5,537,233 A | 7/1996 | Miura et al. |
| 5,863,109 A | 1/1999 | Hsieh |
| 5,949,346 A | 9/1999 | Suzuki et al. |
| 6,022,124 A | 2/2000 | Bourn et al. |
| 6,033,087 A | 3/2000 | Shozo et al. |
| 6,135,612 A | 10/2000 | Clore |
| 6,149,283 A * | 11/2000 | Conway et al. ............. 362/800 |
| 6,682,211 B1 * | 1/2004 | English et al. ............. 362/545 |

FOREIGN PATENT DOCUMENTS

DE            94 15 495 U    11/1994

* cited by examiner

*Primary Examiner*—Stephen F Husar
(74) *Attorney, Agent, or Firm*—Gordon E Gray, III (57) ABSTRACT

The present invention is a soft light fixture. In particular, it is an LED soft light fixture. The preferred embodiment of the soft light fixture has a plurality of light emitting diodes mounted on a perimeter ring aimed to emit light into a light-mixing chamber. The perimeter ring supports a light deflection cap with a lens, preferably translucent. The ring, deflection cap and lens define the light mixing chamber which blends light from the plurality of light emitting diodes into a single light source.

17 Claims, 8 Drawing Sheets

SOFT LIGHT FIXTURE

TECHNICAL FIELD

The present invention is a soft light fixture. In particular, it is an LED soft light fixture.

BACKGROUND ART

Generally, various light fixtures that use light from a combination of light sources are known including U.S. Pat. Nos. 4,280,171, 4,831,755, and 6,149,283.

Often, prior art devices that rely on the light from a combination of light sources show "hot spots." In particular, prior art light fixtures using light emitting diodes ("LEDs") use a large number of LEDs to generate the desired amount and color of light. However, typically, the points at which each individual LED are mounted are usually markedly visible as "hot spots" rather than the light of all the LEDs blending together to form a uniform glow.

Thus, a light fixture that uses a minimum of LEDs to generate a single light source without "hot spots" is desired. Moreover, a light fixture that blends light from different color LEDs into a single blended light source, e.g. of a new color, is desirable as well.

SUMMARY OF THE INVENTION

The present invention is a soft light fixture. In particular, it is an LED soft light fixture. The preferred embodiment of the soft light fixture has a plurality of light emitting diodes mounted on a printed circuit board ring and seated on a perimeter ring. The LEDs are aimed to emit light into a light mixing chamber. The perimeter ring supports a light deflection cap with a lens, preferably translucent. The perimeter ring, deflection cap and lens define the light mixing chamber which blends light from the plurality of light emitting diodes into a single light source. The lens preferably has a skirt that contains the printed circuit board ring, perimeter ring, and deflection cap.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

DETAILED DESCRIPTION OF THE PREFERRED EMBODIMENTS

[1] The following description is provided to enable any person skilled in the art to make and use the invention and sets forth the best modes contemplated by the inventor of carrying out his invention. Various modifications, however, will remain readily apparent to those skilled in the art, since the general principles of the present invention have been defined herein specifically to provide a soft light fixture.

Figure 1A:
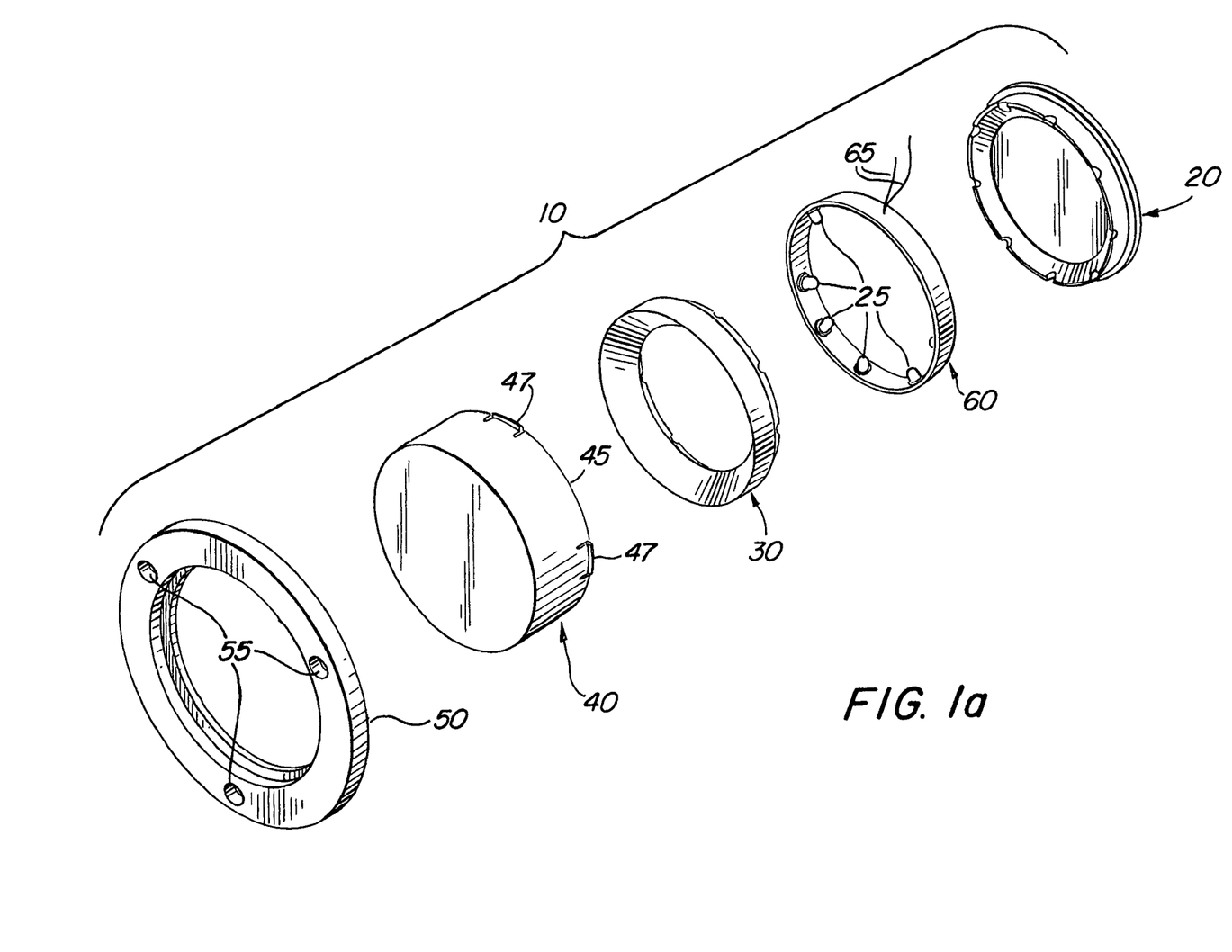
FIG. 1a is an exploded perspective view of a preferred embodiment of the present invention.
Figure 2A:
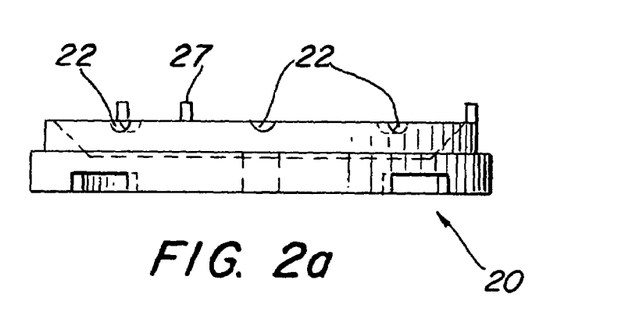
FIG. 2a is a side view of a preferred embodiment of the perimeter ring.
Figure 2B:
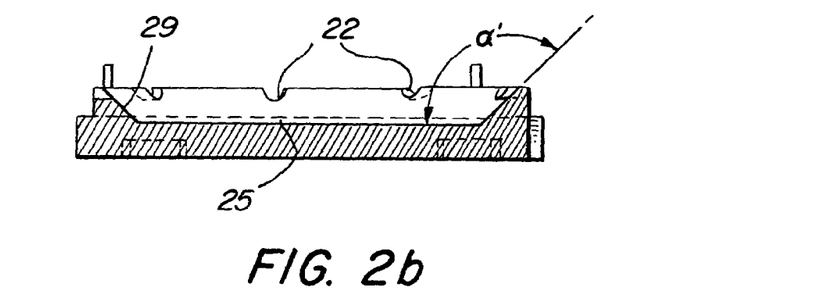
FIG. 2b is a side cross-sectional view of a preferred embodiment of the perimeter ring.
Figure 2C:
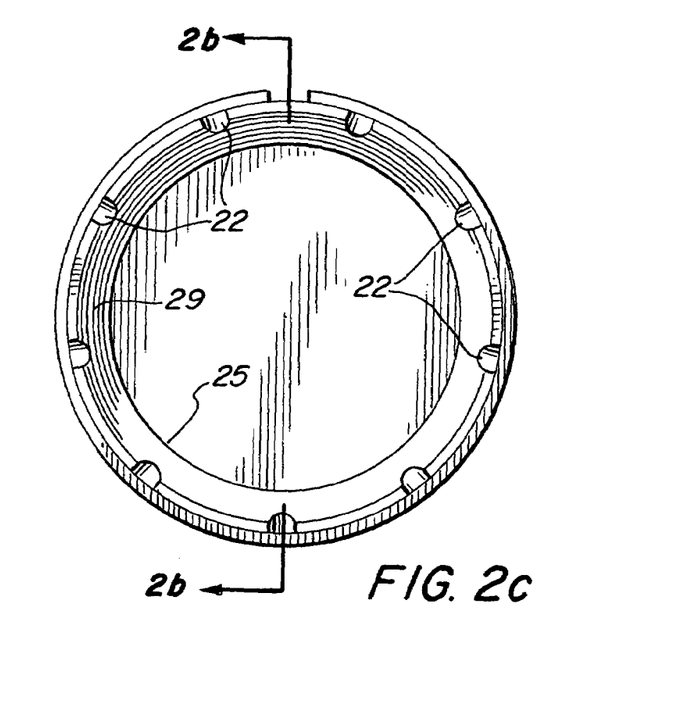
FIG. 2c is a top view of a preferred embodiment of the perimeter ring.

[2] Referring now to FIG. 1a, an exploded perspective view of a preferred embodiment of a soft light fixture 10 is shown. The soft light fixture 10 preferably comprises a perimeter ring 20 having a plurality of notches 22 for lights. A preferred embodiment of the ring 20 is shown in FIGS. 2a, 2b and 2c. There are nine (9) notches 22 shown in FIG. 2c. Returning to FIG. 1a, a number of lights 25, preferably light emitting diodes (LEDs), are mounted on a printed circuit board (PCB) ring 60. The PCB ring 60 is preferably flexible and has two leads 65 for connection to a power source (not shown.) Each LED 25 in turn is seated in a corresponding notch 22 on the perimeter ring 20. Alternatively, each LED can be hard-wired to the fixture 10 instead of using a PCB ring.

[3] Preferably, each PCB ring 60 has a separate circuit for different sets of LEDs. For example, in FIG. 7, the PCB ring 60 has three separate circuits 61, 62 and 63. As shown, each circuit controls three LEDs. This allows different sets of LEDs to be used together. For example, this allows a mix of different voltage LEDs. White, blue and green LEDs commonly need 3.5 volts and red, amber and yellow commonly need 2.5 volts. The separate circuits can also vary the LEDs' intensity and, thus, vary the color and intensity emitted by the light fixture 10.

Figure 7:
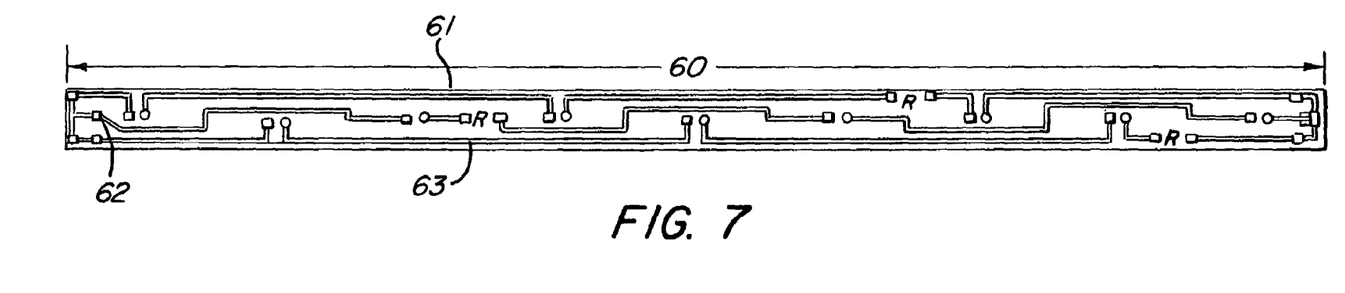
FIG. 7 is a preferred embodiment of a printed circuit board ring for use with the present invention.

[4] By using separate circuits on the PCB ring 60, the PCB ring can have a set of leads 65 for each circuit. Thus, each circuit and set of LEDs can be controlled separately, e.g. dimming or powered higher using a simple dimmer or more sophisticated DMX controller.

[5] The perimeter ring 20 supports a deflection ring 30. The perimeter ring 20 and deflection ring 30 are preferably made of white polycarbonate plastic. Referring to FIG. 2c, the perimeter ring 20 has an interior diameter 25 that is less than the diameter of the perimeter ring 20. The progression from the diameter of the perimeter ring 20 to the interior diameter 25 shown in FIG. 2b is a perimeter slope 29. Preferably, an angle (alpha prime, α') is formed between the perimeter slope 20 and the interior diameter 25. The angle α' is preferably forty-five degrees (45°).

Figure 3A:
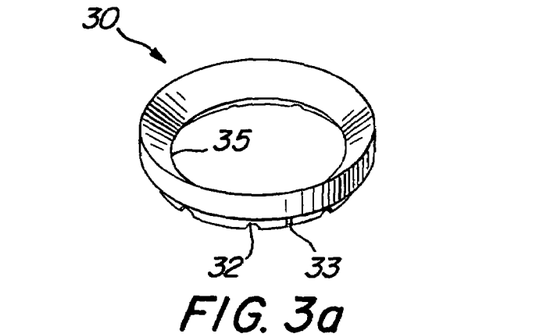
FIG. 3a is a perspective view of a preferred embodiment of the deflection cap.
Figure 3B:
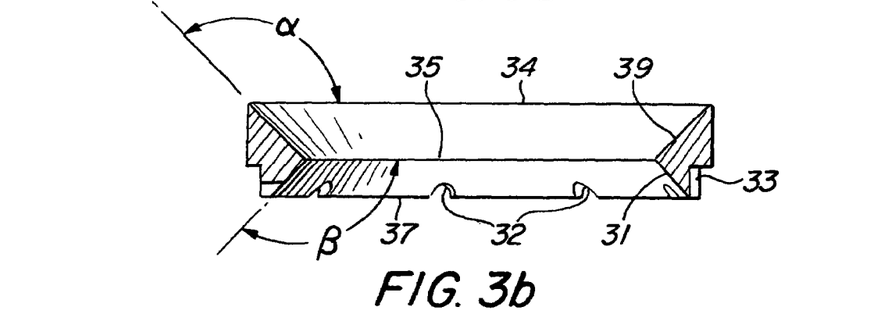
FIG. 3b is a side cross-sectional view of a preferred embodiment of the deflection cap.

[6] The perimeter ring 20 preferably has at least one post 27. Referring now to FIGS. 3a and 3b, a preferred embodiment of the deflection ring or cap is shown. FIG. 3b shows a cross-section of a preferred embodiment of the deflection ring 30. The deflection cap 30 preferably has at least one post port 33 that receives a post 27 on the perimeter ring 20. The deflection ring 30 mounted on the perimeter ring 20 defines a light-mixing chamber. The deflection ring 30 further comprises notches 32 that align with the notches 22 on the perimeter ring 20 to define light ports for seating lights 25, e.g. LEDs. Each light 25 is preferably aimed to cast light into the light mixing chamber.

Figure 4A:
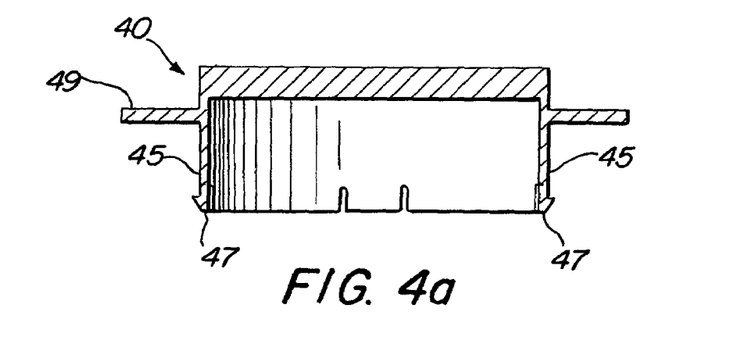
FIG. 4a is a side view of an alternate embodiment of the lens.
Figure 4B:
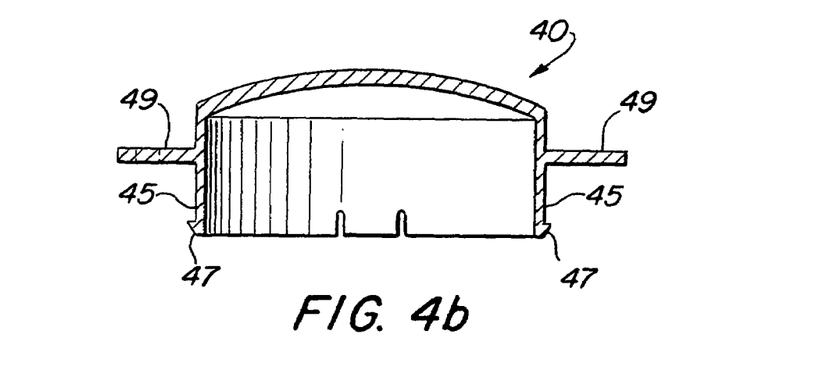
FIG. 4b is a side view of an alternate embodiment of the lens.
Figure 4C:
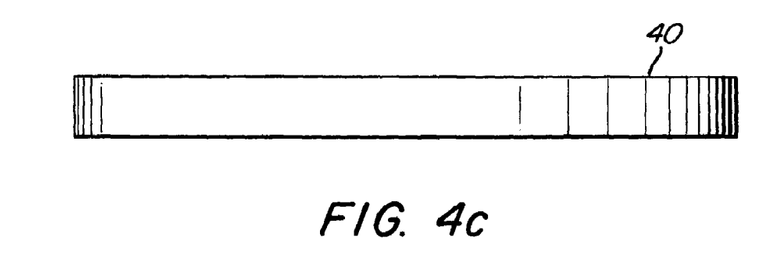
FIG. 4c is a side view of an alternate embodiment of the lens.
Figure 4D:
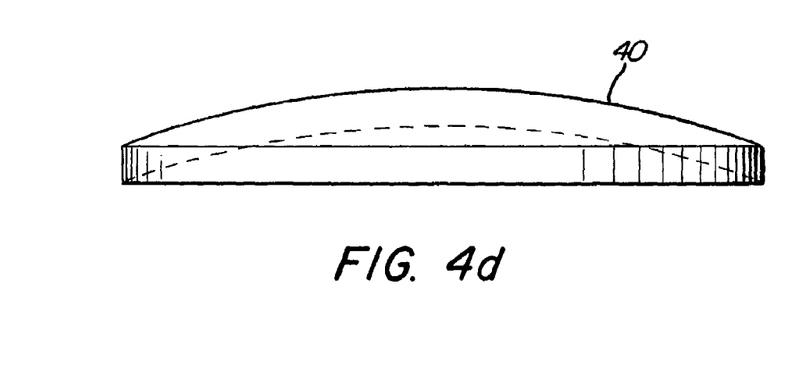
FIG. 4d is a side view of an alternate embodiment of the lens.

[7] A lens 40 tops the deflection ring 30. As shown in FIGS. 1a, 4a and 4b, the lens 40 can have a skirt 45 extending down to contain the perimeter ring 20 and deflection ring 30. Preferably, the skirt 45 comprises tabs 47 arrange along an edge of the skirt 45. Alternately, the tabs 47 can be located on the perimeter ring 20. Regardless of their location, the tabs 47 are generally used to assist in assembling the fixture and/or waterproofing the fixture. Alternatively, one of the lenses 40, shown in FIGS. 4c and 4d, can be mounted on the deflection ring 30. The lens 40 can be flat as shown in FIG. 4c or concave/convex as shown in FIG. 4d. Preferably, the lens 40 is made of translucent white polycarbonate or translucent white acrylic plastic.

Figure 1B:
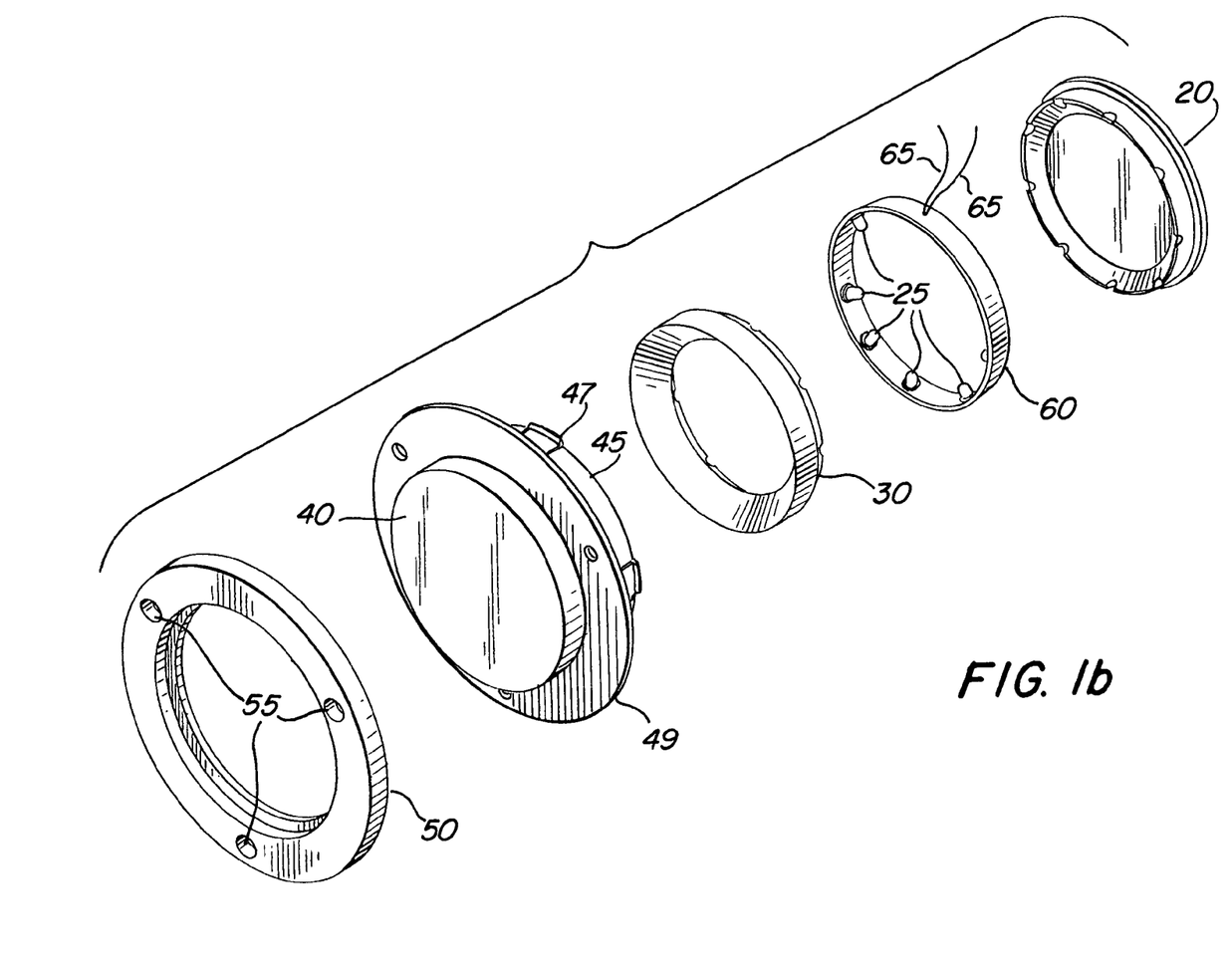
FIG. 1b is an exploded perspective view of an alternative embodiment of the present invention.

[8] As shown in FIG. 1a, a fastener ring 50 with fastener ports 55 can be used to hold the lens 40 together with the deflection ring 30 and perimeter ring 20 or mount the fixture 10 to a surface, e.g. a wall, chair, or floor. FIGS. 1b, 4a and 4b show an alternative embodiment of the lens 40 with a flange 49. The flange 49 can be used to mount the fixture 10 to other external fixture housings.

[9] Referring to FIGS. 3a and 3b, the deflection ring 30 has an interior diameter 35 that is less than the diameter of the perimeter ring 20. Preferably, the deflection ring's interior surface slopes to the interior diameter 35. This progression to the interior diameter 35 creates a deflection slope 39 that deflects light from the LEDs 25 into the light mixing chamber. Preferably, the deflection slope 39 extended forms an angle (alpha, α) at least 135 degrees from a top diameter 34 of the deflection ring 30.

[10] Conversely, the interior diameter 35 is less than a lower diameter 37. This progression from the lower diameter 37 to the interior diameter 35 shown in FIG. 3b is notch slope 31. Preferably, the notch slope 31 extended forms an angle (beta, β) of 135° from the lower diameter 37 of the deflection ring 30. Thus, the LEDs 25 are generally obscured from direct view by the slope 39 of the deflection ring 30. Instead, the light from the LEDs is reflected into the light-mixing chamber defined by the above-described components to produce a soft light visible to a viewer without "hot spots."

[11] It should be noted that the present invention generates consistent lighting out to the outer edge of the fixture 10. The fixture 10, in general, does not have, what is commonly called a "trim ring," namely a dark ring along the edge of the lens 40. Thus, the fastener ring 50 is not used to hide a dark ring at the edge of the lens 40 but, instead, is used for mounting purposes and other reasons described above.

Figure 5A:
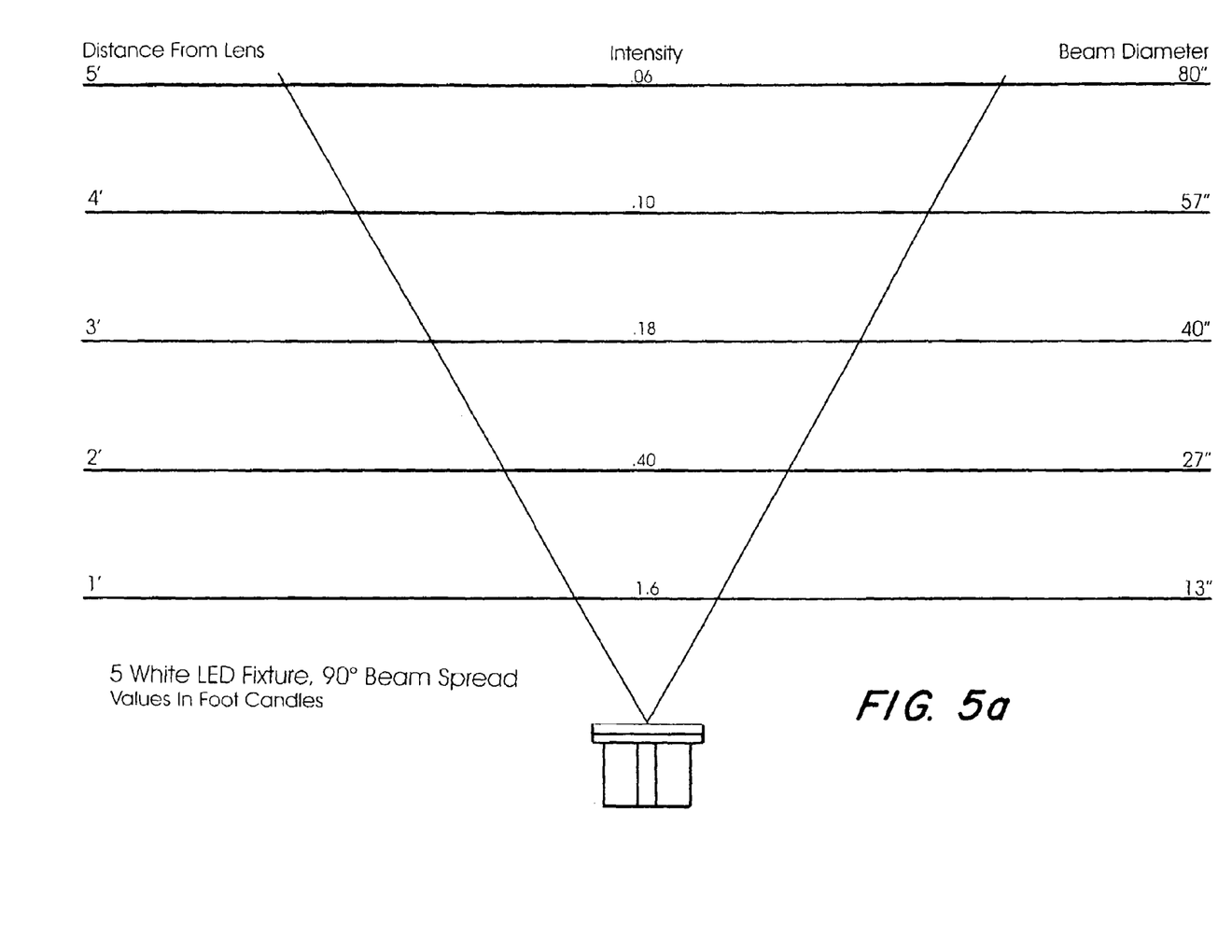
FIGS. 5a, 5b, and 5c are graphs of light intensity, beam diameter as a function of distance from the lens of the present invention.
Figure 5B:
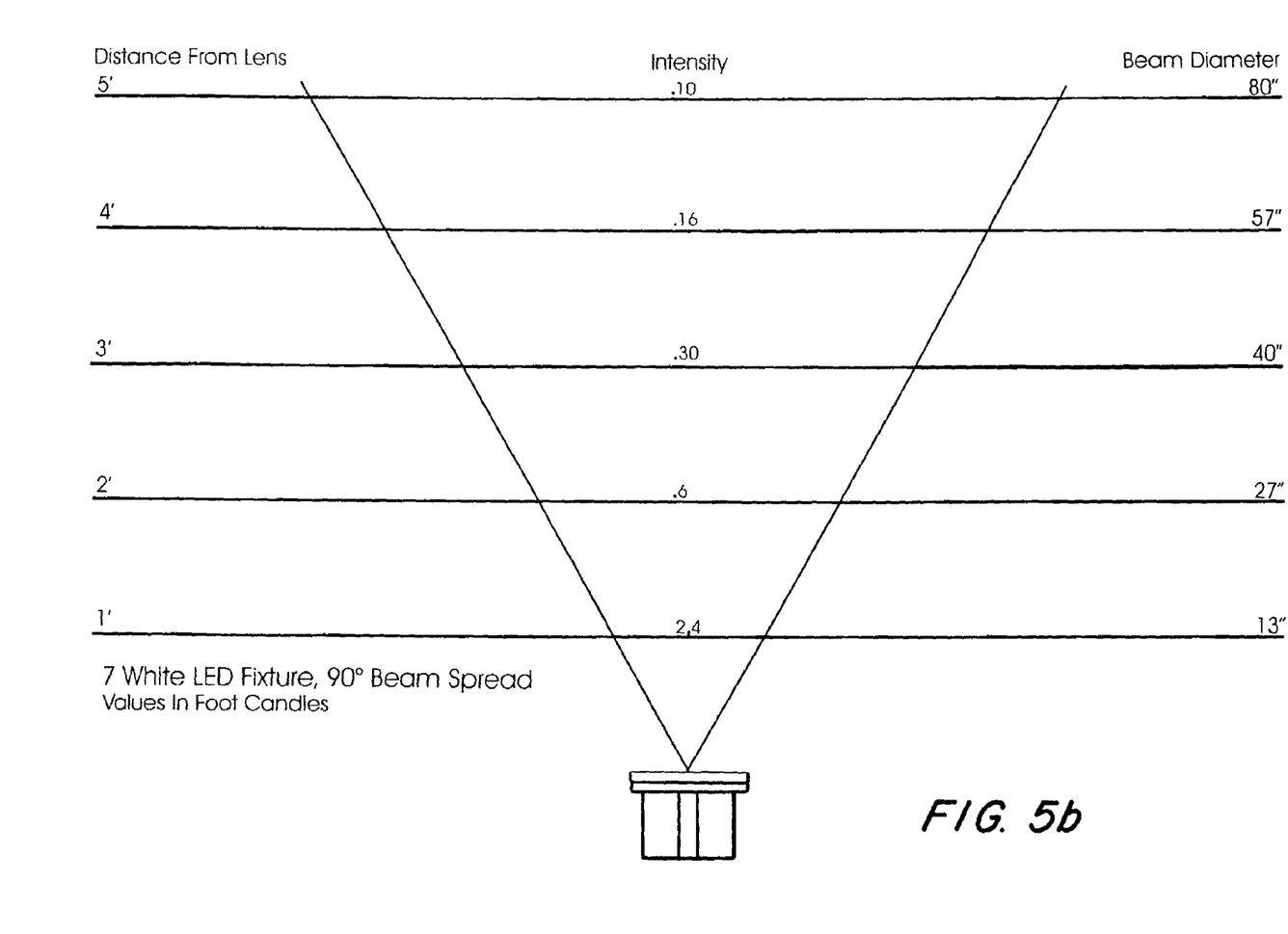
Figure 5C:
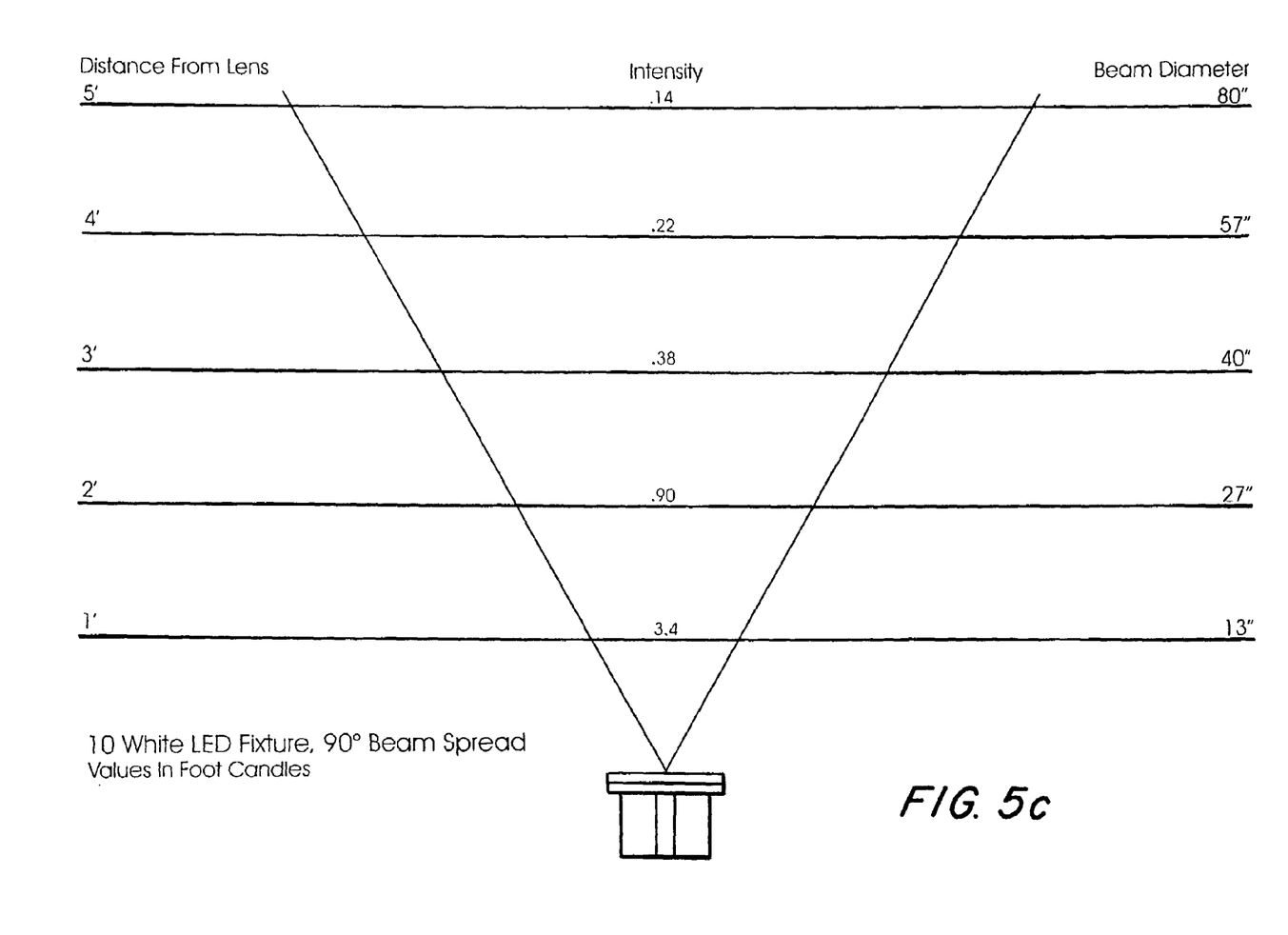
Figure 6:
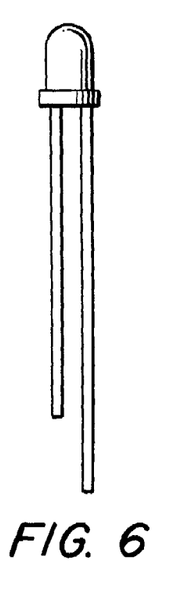
FIG. 6 is a preferred embodiment of an unmounted LED for use with the present invention.

[12] Referring now to FIGS. 5a–5c, this invention 10 provides a soft light of an intensity useful in a number of applications. FIGS. 5a–5c show graphs of beam spread and intensity as functions of distance from the fixture 10. Referring to FIG. 6, preferably, the LEDs are 20–40 milliamps (ma) light emitting diodes. If white light is desired, then only white LEDs are mounted in the notches 22 defined by the perimeter and deflection rings. Alternately, using a combination of colored LEDs mounted in the notches 22 can create soft lighting with a variety of colors. For example, if a "pink-ish" light is desired, six red LEDs and three white LEDs could be mounted on the PCB ring 60 in order to cast a pink-ish light from the device 10. Another alternative is to color the lens 40 the desired color or use a colored gel with the fixture 10.

[13] One preferred embodiment of the invention as described above uses three sets of three LEDs. Thus, combinations of LEDs are preferably based on multiples of three, e.g. three red LEDs and six white LEDs or six red LEDs and three white LEDs. The different circuits on the PCB ring 60 can also vary the color of light emitted by the fixture 10. For example, two sets of three LEDs could run at 20 milliamps while a third set runs at 40 milliamps. The resistors for each circuit could also be changed to vary the power, brightness and intensity of the LEDs as well.

[14] The present invention provides an improved color consistency over the prior art as well. Typically, when dies of LEDs are produced, the LEDs are sorted into bins by a number of criteria including a large range of "acceptable" colors, or wavelengths, intensity and forward voltage. The LEDs, depending on tolerance for color variation, can be sorted several more times to isolated colors within ranges of 1–3 nanometers in wavelength. However, isolating LEDs of a color with 1 nanometer of wavelength can be very expensive. The present invention allows LEDs of a wider variation in wavelength to be used and their light mixed to produce a single color light and thus hide slight variations in color between LEDs.

[15] Thus, a soft light fixture is described above that uses a minimum of LEDs to generate a single light source without "hot spots" is described. Moreover, a light fixture that blends light from different color LEDs into a single blended light source of a new color is described as well. In each of the above embodiments, the different positions and structures of the present invention are described separately in each of the embodiments. However, it is the full intention of the inventors of the present invention that the separate aspects of each embodiment described herein may be combined with the other embodiments described herein. Those skilled in the art will appreciate that adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A light fixture comprising:
   a plurality of lights mounted on a perimeter structure, the structure supporting a light deflection cap that deflects light from the lights into a light mixing chamber; where the structure and cap surround the light mixing chamber; and,
   where at least one side of the light mixing chamber is covered by a lens, and where the deflection cap is positioned between the lens and the perimeter structure.

2. The light fixture of claim 1 where the plurality of lights are light emitting diodes.

3. A light fixture comprising:
   a plurality of lights mounted on a perimeter structure, the structure supporting a light deflection cap that deflects light from the lights into a light mixing chamber; where the structure and cap surround the light mixing chamber;
   where at least one side of the light mixing chamber is covered by a lens; and, where the perimeter structure has an interior diameter greater than an interior diameter of the light deflection cap.

4. The light fixture of claim 3 where the lens and the light mixing chamber blend light from the plurality of lights into a single light source.

5. The light fixture of claim 4 where the lens has a perimeter edge and the single light source casts light to the perimeter edge of the lens.

6. A soft light fixture comprising a plurality of light emitting diodes mounted on a perimeter structure supporting a light deflection cap around a light mixing chamber, where an interior diameter of the perimeter structure is greater than an interior diameter of the light deflection cap; and,
   a lens covering at least one side of the light mixing chamber whereby the lens, the light deflection cap, and the light mixing chamber blend light from the plurality of light emitting diodes into a single light source.

7. The soft light fixture of claim 6 where the perimeter structure is a ring.

8. The soft light fixture of claim 6 where the lens is translucent.

9. The soft light fixture of claim 6 where the plurality of light emitting diodes comprise diodes of at least two different colors.

10. The soft light fixture of claim 6 where the mixing chamber, light deflection cap and lens blend the light from diodes of at least two different colors into a single light source of a third color.

11. The soft light fixture of claim 6 where at least one side of the lens is convex.

12. A soft light fixture comprising:
   a light mixing chamber defined by a perimeter ring supporting a light deflection cap and a lens;
   where the perimeter ring and light deflection cap further define a plurality of light ports containing a light emitting diode in each light port aimed to cast light into the light mixing chamber;
   each light emitting diode is mounted to a flexible printed circuit board ring; and,
   where the lens covers at least one side of the light mixing chamber whereby the lens, the light deflection cap, and the light mixing chamber blend light from the plurality of light emitting diodes into a single light source.

13. The soft light fixture of claim 12 where the light deflection cap further comprises an interior diameter less than a diameter of the perimeter ring.

14. The soft light fixture of claim 12 where the interior diameter of the light deflection cap forms at most a 135-degree angle with a top diameter of the light deflection cap.

15. The soft light fixture of claim 13 where the perimeter ring, light deflection cap and the lens are made from white polycarbonate plastic.

16. The soft light fixture of claim 12 where the plurality of light emitting diodes comprise diodes of at least two different colors and where the mixing chamber, light deflection cap and lens blend the light from the diodes into a single light source of a third color.

17. A method for creating a soft light fixture that casts a predetermined color of light comprising the following steps:
   choosing a color of light to be cast from the light fixture;
   mounting a combination of light emitting diodes on a printed circuit board ring to generate the color of light; and,
   seating the combination of light emitting diodes in a plurality of light ports of a light fixture having a perimeter ring, a deflection cap and a lens.

* * * * *